(12) United States Patent
Bae et al.

(10) Patent No.: US 11,700,744 B2
(45) Date of Patent: Jul. 11, 2023

(54) ENCAPSULATION FILM INCLUDING METAL LAYER AND PROTECTIVE LAYER WITH RESIN COMPONENT

(71) Applicant: LG CHEM, LTD., Seoul (KR)

(72) Inventors: Kyung Yul Bae, Daejeon (KR); Hyun Jee Yoo, Daejeon (KR); Jung Woo Lee, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 433 days.

(21) Appl. No.: 16/954,897

(22) PCT Filed: Dec. 18, 2018

(86) PCT No.: PCT/KR2018/016119
§ 371 (c)(1),
(2) Date: Jun. 17, 2020

(87) PCT Pub. No.: WO2019/124934
PCT Pub. Date: Jun. 27, 2019

(65) Prior Publication Data
US 2020/0381664 A1    Dec. 3, 2020

(30) Foreign Application Priority Data
Dec. 18, 2017  (KR) .................. 10-2017-0174040

(51) Int. Cl.
*H10K 50/844* (2023.01)
*H10K 71/00* (2023.01)
(Continued)

(52) U.S. Cl.
CPC ........... *H10K 50/844* (2023.02); *B32B 15/08* (2013.01); *B32B 27/38* (2013.01);
(Continued)

(58) Field of Classification Search
CPC . H01L 51/5253; H01L 51/5246; H01L 51/56; B23B 15/08; B32B 27/38; H10K 50/844; H10K 71/00
See application file for complete search history.

(56) References Cited

U.S. PATENT DOCUMENTS 10,374,190 B2    8/2019  Tazaki et al.
2006/0051698 A1*  3/2006  Miyoshi ................ G11B 7/252
(Continued)

FOREIGN PATENT DOCUMENTS

CN    105210210 A    12/2015
CN    105830533 A    8/2016
(Continued)

OTHER PUBLICATIONS

Soumen Mandal in "Suitability Assessment of Ethylene-Vinyl-Acetate (EVA) as a Material for Dynamic Photoelastic Coating," The AZo Journal of Materials Online, May 29, 2012, pp. 1-9. Retrieved from URL: http://www.azom.com/article.aspx?ArticleID=6043 (Year: 2012).*

(Continued)

*Primary Examiner* — Michael Jung
(74) *Attorney, Agent, or Firm* — Dentons US LLP

(57) ABSTRACT

The present application provides an encapsulation film comprising an encapsulation layer, a metal layer, and a protective layer. The encapsulation film provides a structure capable of blocking moisture or oxygen introduced into an organic electronic device from the outside, minimizes the appearance change of the film due to excellent handling properties and processability, and prevents physical and chemical damage during encapsulation process.

16 Claims, 2 Drawing Sheets

(51) Int. Cl.
 B32B 15/08 (2006.01)
 B32B 27/38 (2006.01)
 H10K 50/842 (2023.01)
 H10K 102/10 (2023.01)
(52) U.S. Cl.
 CPC ......... *H10K 50/8426* (2023.02); *H10K 71/00* (2023.02); *H10K 2102/102* (2023.02); *H10K 2102/103* (2023.02)

(56) References Cited

U.S. PATENT DOCUMENTS

| | | | |
|---|---|---|---|
| 2015/0064401 A1* | 3/2015 | Honda | B32B 27/00 |
| | | | 428/447 |
| 2016/0056421 A1 | 2/2016 | Kim et al. | |
| 2017/0040570 A1 | 2/2017 | Kim et al. | |
| 2017/0077450 A1 | 3/2017 | Kim et al. | |
| 2020/0388793 A1* | 12/2020 | Shimogawara | H05B 33/04 |

FOREIGN PATENT DOCUMENTS

| | | |
|---|---|---|
| CN | 106463622 A | 2/2017 |
| EP | 3089551 A1 | 11/2016 |
| EP | 3 089 551 B1 | 4/2020 |
| EP | 3089551 B1 | 4/2020 |
| JP | 2014-146582 A | 8/2014 |
| JP | 2015-196272 A | 11/2015 |
| JP | 2016204454 A | 12/2016 |
| JP | 2017512360 A | 5/2017 |
| KR | 10-2015-0097435 A | 8/2015 |
| KR | 10-2016-0101694 A | 8/2016 |
| KR | 10-2016-0102181 A | 8/2016 |
| TW | 201221550 A | 6/2012 |
| TW | 201603344 A | 1/2016 |
| TW | 1549820 B | 9/2016 |
| TW | 201700667 A | 1/2017 |
| TW | 1575052 B | 3/2017 |
| WO | 2014192839 A1 | 12/2014 |

OTHER PUBLICATIONS

Chen et al., RSC Advances "Facile preparation of epoxy based elastomers with tunable TgS and mechinical properties," Jan. 2018, (pp. 13474-13481).

* cited by examiner

[Figure 1]
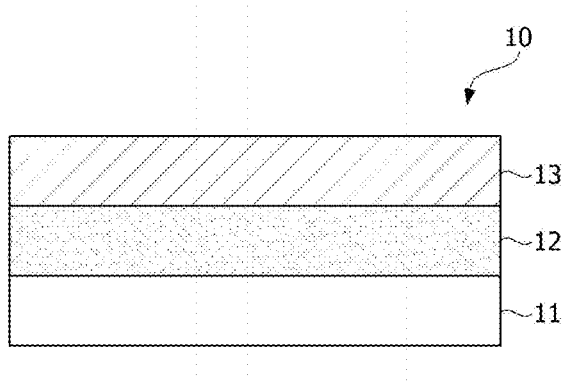
[Figure 2]
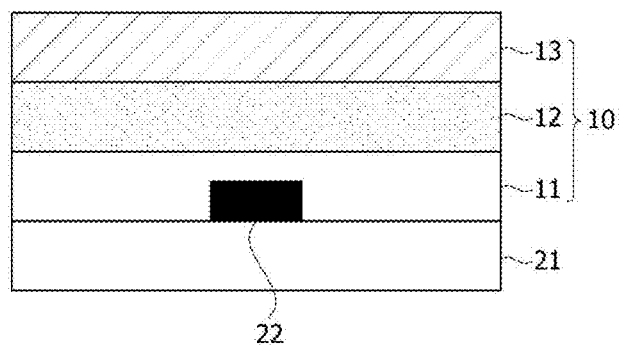
[Figure 3]
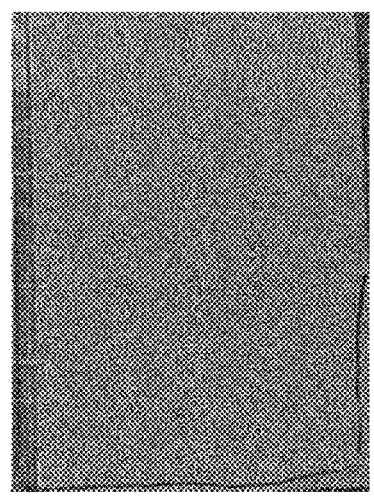

[Figure 4]
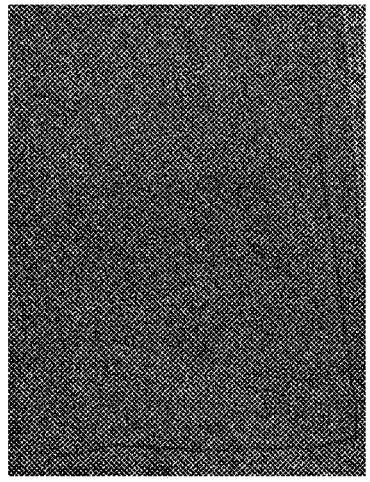
[Figure 5]
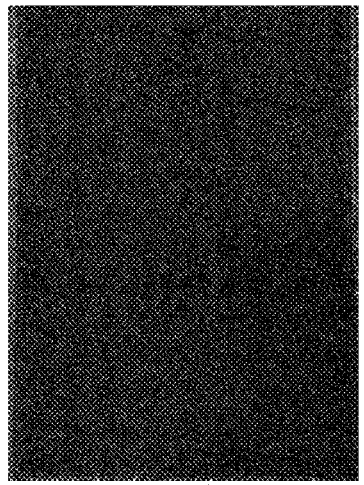
[Figure 6]
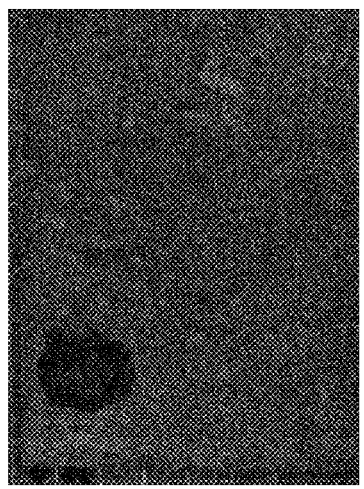

ENCAPSULATION FILM INCLUDING METAL LAYER AND PROTECTIVE LAYER WITH RESIN COMPONENT

CROSS-REFERENCE TO RELATED APPLICATIONS

This application is a U.S. national stage of international Application No. PCT/KR2018/016119, filed Dec. 18, 2018, and claims priority to and the benefit of Korean Patent Application Nos. 10-2017-0174040, filed Dec. 18, 2017, the entire contents of which are incorporated by reference as if fully set forth herein.

TECHNICAL FIELD

The present disclosure relates to an encapsulation film, an organic electronic device comprising the same, and a method for manufacturing an organic electronic device using the same.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. Organic materials and metal electrodes, and the like contained in the OLED are very easily oxidized by external factors such as moisture. Thus, products containing OLEDs are highly sensitive to environmental factors. Accordingly, an encapsulating material is used to protect the OLED, and it is important to maintain endurance reliability of the encapsulating material in the process of encapsulation of the OLED with the encapsulating material.

DISCLOSURE

Technical Problem

The present application provides an encapsulation film which provides a structure capable of blocking moisture or oxygen introduced into an organic electronic device from the outside, minimizes the appearance change of the film due to excellent handling properties and processability, and prevents physical and chemical damage during encapsulation process.

Technical Solution

The present application relates to an encapsulation film. The encapsulation film can be applied to sealing or encapsulating an organic electronic device such as, for example, OLEDs. In this specification, the encapsulation film may be expressed as a sealing material or an encapsulating material.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present invention, the organic electronic device may be an OLED.

An exemplary encapsulation film may comprise an encapsulation layer, a metal layer, and a protective layer. As shown in FIG. 1, the encapsulation film (10) may comprise an encapsulation layer (11), a metal layer (12) and a protective layer (13) sequentially, where the encapsulation layer (11) may seal the entire surface of an organic electronic element to be described below. Here, the protective layer (13) may comprise a resin component, where the resin component may have a glass transition temperature after curing in a range of 0° C. or higher, 50° C. to 200° C., 80° C. to 180° C., or 85° C. to 150° C. In providing an encapsulation film for encapsulating the entire surface of an organic electronic element in an organic electronic device, the present invention comprises a protective layer for preventing physical and chemical damage from the outside during an encapsulation process. In the above structure, by comprising a resin component with a specific glass transition temperature range in the protective layer, the present application can prevent appearance damage of the film due to external moisture.

In one example, the protective layer may have a thickness in a range of more than 5 μm, 50 μm or less, 6 to 48 μm, 10 to 43 μm, 13 to 38 μm, or 14 to 33 μm. In addition, the thickness of the protective layer may be thinner than the thickness of the metal layer as described above, and may have a value of ½ times or more the thickness of the metal layer, but is not limited thereto. By adjusting the thickness of the protective layer to the above range, the present application can prevent the metal layer from being corroded by contact with the moisture during the process, and can realize a thin organic electronic device while preventing damage due to folding or bending in the process.

In one example, the resin component of the protective layer may have a glass transition temperature of 0° C. or higher, 50° C. to 200° C., 80° C. to 180° C., or 85° C. to 150° C. after curing, as described above. In this specification, the glass transition temperature may be a physical property after curing. Unless otherwise specified herein, the glass transition temperature may mean a glass transition temperature after curing it at any temperature between 50 and 300° C. for 20 minutes to 200 minutes; a glass transition temperature after irradiating it with ultraviolet rays at an irradiance level of 1 J/cm² to 10 J/cm²; or a glass transition temperature after the ultraviolet ray irradiation, followed by the thermal curing.

In one example, the protective layer may have a tensile elastic modulus at 25° C. of 0.01 MPa to 1,000 MPa. The tensile modulus can be measured by a method known in the art. For example, the protective layer was produced to have a thickness of 5 to 100 μm or 10 to 30 μm, and the produced protective layer was cut to a size of 50 mm×10 mm (length×width) by setting the coating direction at the time of production as the longitudinal direction to prepare a specimen, and then the specimen was taped so that both ends were left only 25 mm in the longitudinal direction. Subsequently, while the taped portions were gripped and stretched at a rate of 1 mm/min at 25° C., the tensile elastic modulus was measured. In one example, the tensile elastic modulus of the protective layer may be in a range of 0.01 MPa to 1000 MPa, 0.1 MPa to 900 MPa, 0.5 MPa to 800 MPa, 0.8 MPa to 600 MPa, 1 MPa to 500 MPa, 3 MPa to 400 MPa, 5 MPa to 300 MPa, 7 MPa to 150 MPa, or 8 MPa to 95 MPa at 25° C. When the encapsulation film is applied to an organic electronic device, the present application can minimize step differences of the respective layers constituting the encapsulation film and prevent panel warpage by adjusting the tensile elastic modulus range, despite the shrinkage or expansion of the encapsulation film.

The protective layer of the present application may be a single layer, but is not limited thereto, which may also be formed into a multi-layer structure. The present application provides an encapsulation film which can sufficiently maintain its performance even with a protective layer of a single layer by using the above-mentioned protective layer.

In an embodiment of the present application, the resin component of the protective layer may be a curable resin. The specific kind of the curable resin that can be used in the present application is not particularly limited, and for example, various thermosetting resins, photo-curable resins or dual curing resins known in the art can be used. The term "thermosetting resin" means a resin that can be cured through an appropriate heat application or aging process, and the term "photo-curable resin" means a resin that can be cured by irradiation with electromagnetic waves. Furthermore, the curable resin may be a dual curing resin including both of heat curing properties and light curing properties.

The specific kind of the curable resin in the present application is not particularly limited as long as it has the above-mentioned characteristics. For example, it may be cured to exhibit an adhesive property, which may include a resin containing one or more thermosetting functional groups such as a glycidyl group, an isocyanate group, a hydroxyl group, a carboxyl group or an amide group, or containing one or more functional groups curable by irradiation with electromagnetic waves, such as an epoxide group, a cyclic ether group, a sulfide group, an acetal group or a lactone group. A specific example of such a resin may include an acrylic resin, a polyester resin, an isocyanate resin or an epoxy resin, and the like, but is not limited thereto.

In this application, as the curable resin, aromatic, alicyclic or aliphatic; or linear or branched epoxy resins may be used. In one embodiment of the present invention, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or a mixture of two or more of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

The resin component may comprise, for example, a curable oligomer and a curable monomer among the curable resins. The curable oligomer may be a compound having a weight average molecular weight in a range of 400 to 10,000 g/mol, 500 to 8000 g/mol, 800 to 6000 g/mol, 1000 to 5000 g/mol or 1500 to 4000 g/mol, and the curable monomer may mean a compound having a weight average molecular weight of less than 400 g/mol, 50 to 380 g/mol or 100 to 300 g/mol. The curable oligomer may have a weight average molecular weight higher than that of the curable monomer.

In an embodiment of the present application, the curable oligomer and the curable monomer may be included in amounts of 15 to 35 parts by weight and 10 to 40 parts by weight; 18 to 33 parts by weight and 13 to 35 parts by weight; or 25 to 31 parts by weight and 18 to 28 parts by weight, respectively. In this specification, the part by weight may mean a weight ratio between the respective components. By comprising the curable oligomer and the curable monomer, the present application can suppress hydrolysis by external moisture in the atmosphere to prevent appearance damage of the film.

Although the kind of the curable oligomer is not particularly limited, it may be in the form of an oligomer such as a biphenyl type epoxy resin, a dicyclopentadiene type epoxy resin, a naphthalene type epoxy resin, a dicyclopentadiene modified phenol type epoxy resin, a cresol-based epoxy resin, a bisphenol-based epoxy resin, a xylox-based epoxy resin, a multifunctional epoxy resin, a phenol novolac epoxy resin, a triphenolmethane type epoxy resin and an alkyl modified triphenolmethane epoxy resin, but is not limited thereto. In one example of the present application, the oligomer may be a hydrogenated compound. The kind of the curable monomer is 3,4-epoxycyclohexylmethyl 3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, 1,2-ethane diglycidyl ether and derivatives, 1,3-propane diglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyl dioxide and derivatives, 1,4-cyclohexanedimethanol bis(3,4-epoxycyclohexanecarboxylate) and derivatives, diglycidyl 4,5-epoxytetrahydrophthalate and derivatives, bis[1-ethyl(3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolac, hydrogenated epoxyphenol novolac, epoxycresol novolac, hydrogenated epoxycresol novolac, 2-(7-oxabicyclospiro(1,3-dioxane-5,3'-(7-oxabicyclo[4.1.0]heptane)), or 1,4-bis((2,3-epoxypropoxy)-methyl)cyclohexane.

In the present application, an epoxy resin containing a cyclic structure in the molecular structure may be used as the curable resin, and an epoxy resin containing an aromatic group (e.g., phenyl group) or an alicyclic group may be used. When the epoxy resin contains a cyclic structure, the cured product can improve the reliability of the encapsulating structure by exhibiting a low moisture absorption amount while having excellent thermal and chemical stability.

In an embodiment of the present application, the protective layer may further comprise a curing agent or initiator for curing the resin component. In one example, the curing agent is a curing agent known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the resin component. For example, the curing agent may be included in an amount of 1 part by weight to 20 parts by weight, 1 part by weight to 10 parts by weight or 1 part by weight to 5 parts by weight, relative to 100 parts by weight of the resin component. However, the weight ratio can be changed depending on the type and ratio of the resin component or the functional group of the resin, or the cross-linking density to be implemented, and the like.

In one example, the protective layer may further comprise a binder resin. The binder resin may be a high molecular weight resin having a weight average molecular weight in a range of 20,000 g/mol or more, 20,000 to 500,000 g/mol, or 30,000 to 150,000 g/mol. A specific example of the resin may include one or a mixture of two or more of an olefin-based resin, a phenoxy resin, an acrylate resin, a high molecular weight epoxy resin, an ultrahigh molecular weight epoxy resin, a rubber component, high polarity functional group-containing rubber, and high polarity functional group-containing reactive rubber, and the like, but is not limited thereto. In one embodiment, the binder resin may be exemplified by a styrene isobutylene copolymer or a BPA type phenoxy resin, but is not limited thereto. Also, the binder resin may also have a glass transition temperature of 0° C. or higher as the above-described protective layer resin component, but is not limited thereto. The protective layer of the present application may comprise, as the resin component, the curable oligomer, the curable monomer and/or the binder resin as described above, and one or more, or two or more resin components of the resin components may have a glass transition temperature of 0° C. or higher. In one example, all of the resin components contained in the protective layer may also have a glass transition temperature of 0° C. or higher after curing.

The binder resin may be included in a range of, for example, 30 to 90 wt %, 35 to 80 wt %, 40 to 70 wt %, or 45 to 65 wt % in the entire composition in the protective layer. Within the above content range, the present application may embody a protective layer having desired physical properties.

In an embodiment of the present application, the metal layer of the encapsulation film may be transparent and opaque. The metal layer may be a thin metal foil or a polymer base layer deposited with metal. As the metal layer, a material having moisture barrier properties and containing a metal can be used without limitation. The metal layer may comprise any of a metal, a metal oxide, a metal nitride, a metal carbide, a metal oxynitride, a metal oxyboride, and a combination thereof. For example, the metal layer may comprise an alloy in which one or more metal elements or non-metal elements are added to one metal, and may comprise, for example, an iron-nickel alloy or stainless steel (SUS). Furthermore, in one example, the metal layer may comprise iron, copper, aluminum nickel, silicon oxide, aluminum oxide, titanium oxide, indium oxide, tin oxide, indium tin oxide, tantalum oxide, zirconium oxide, niobium oxide and a combination thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer may be deposited by reactive sputtering.

In one example, the thickness of the metal layer is not particularly limited, but may be in a range of 10 to 100 μm, 13 to 80 μm, 15 to 50 μm, or 17 to 25 μm.

Preferably, the metal layer of the present application as described above may have thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. By having such high thermal conductivity, the heat generated at the bonding interface upon the metal layer bonding process can be released more quickly. Also, the heat accumulated during the operation of the organic electronic device is rapidly released because of the high thermal conductivity, whereby the temperature of the organic electronic device itself can be kept lower, and the occurrence of cracks and defects is reduced.

The term "thermal conductivity" herein is a degree representing capability in which a material is capable of transferring heat by conduction, where the unit may be expressed by W/mK. The unit represents the degree to which the material transfers heat at the same temperature and distance, which means a unit of heat (watt) to a unit of distance (meter) and a unit of temperature (Kelvin).

In an embodiment of the present application, the encapsulation layer may comprise a pressure-sensitive adhesive composition or an adhesive composition to form a pressure-sensitive adhesive layer or an adhesive layer. The encapsulation layer may be a single layer or a multi-layer structure of two or more layers. When two or more layers constitute the encapsulation layer, the compositions of the respective layers in the encapsulation layer may be the same or different, and it may comprise a first layer and/or a second layer to be described below.

In one example, the encapsulation layer may comprise an encapsulating resin. The encapsulating resin may be a resin having a glass transition temperature of less than 0° C., −10° C. or lower, −20° C. or lower, −30° C. or lower, or −40° C. or lower after curing. When the encapsulation layer of the present application is a single layer, the encapsulation layer of the single layer may comprise an encapsulating resin having the above glass transition temperature range. In an embodiment of the present application, when the encapsulation layer is a multi-layer, it may comprise a first layer and a second layer, where the encapsulating resin constituting the first layer may have a glass transition temperature of 85° C. or higher, 90° C. or higher, 95° C. or higher, or 100° C. or higher. The encapsulating resin constituting the second layer of the encapsulation layer may be a resin having a glass transition temperature of less than 0° C., for example, −10° C. or lower, −20° C. or lower, −30° C. or lower, or −40° C. or lower.

In one example, the encapsulating resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one example, the encapsulation layer may comprise, but is not limited to, the olefin elastomer, the silicone elastomer or the acrylic elastomer, and the like among the above-mentioned types as the encapsulating resin.

In one embodiment of the present application, the encapsulating resin may be an olefin-based resin. In one example, the encapsulating resin may comprise a polymer derived from butylene. The polymer derived from butylene may mean that one or more of the polymerized units of the polymer are composed of butylene. Since the polymer derived from butylene has a very low polarity, is transparent and has little effect on corrosion, excellent moisture barrier properties and endurance reliability can be realized when used as a sealing material or an encapsulating material.

In the present application, the polymer derived from butylene may also be a homopolymer of a butylene monomer; a copolymer obtained by copolymerizing a butylene monomer and another polymerizable monomer; a reactive oligomer using a butylene monomer; or a mixture thereof. In the present application, the derived polymer may mean that the monomers form a polymer in polymerized units. The butylene monomer may include, for example, 1-butene, 2-butene or isobutylene.

Other monomers polymerizable with the butylene monomers or derivatives may include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer may comprise a butylene polymer having a reactive functional group. The oligomer may have a weight average molecular weight ranging from 500 to 5,000 g/mol. Furthermore, the butylene polymer may be coupled to another polymer having a reactive functional group. The other polymer may be, but is not limited to, alkyl (meth) acrylate. The reactive functional group may be a hydroxyl group, a carboxyl group, an isocyanate group or a nitrogen-containing group. Also, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In the encapsulation layer, the resin or elastomer component may have a weight average molecular weight (Mw) to an extent such that the pressure-sensitive adhesive composition can be formed into a film shape. For example, the resin or elastomer may have a weight average molecular weight of about 100,000 to 2,000,000 g/mol, 150,000 to 1,500,000 g/mol, or 330,000 to 1,000,000 g/mol or so. The term weight average molecular weight herein means a value converted to standard polystyrene measured by GPC (gel permeation chromatograph). However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In an embodiment of the present application, the encapsulation layer of the present application may comprise an active energy ray polymerizable compound which is highly compatible with the encapsulating resin and can form a specific cross-linked structure together with the encapsulating resin.

For example, the encapsulation layer of the present application may comprise, depending on the type of the encapsulating resin, a multifunctional active energy ray polymerizable compound that can be polymerized by irradiation of an active energy ray together with the encapsulating resin. The active energy ray polymerizable compound may mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

Also, the active energy ray polymerizable compound may be included in an amount of 3 parts by weight to 30 parts by weight, 5 parts by weight to 25 parts by weight, 8 parts by weight to 20 parts by weight, 10 parts by weight to 18 parts by weight or 12 parts by weight to 18 parts by weight, relative to 100 parts by weight of the encapsulating resin. The present application provides a film having excellent reliability at high temperature and high humidity by introducing an appropriate crosslinking structure into the encapsulation layer within the above range.

The multifunctional active energy ray polymerizable compound which can be polymerized by irradiation of the active energy ray, for example, the compound may include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol di(meth)acrylate, dimethyloldicyclopentane di(meth)acrylate, neopentylglycol-modified trimethylol propane di(meth)acrylate, admantane di(meth)acrylate, trimethylolpropane tri(meth)acrylate, or a mixture thereof.

As the multifunctional active energy ray polymerizable compound, for example, a compound having a molecular weight of less than 1,000 g/mol and 100 g/mol or more and containing two or more functional groups can be used. In this case, the molecular weight may mean a weight average molecular weight or a typical molecular weight. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 parts by weight to 20 parts by weight, 0.5 to 18 parts by weight, 1 to 15 parts by weight, or 2 parts by weight to 13 parts by weight, relative to 100 parts by weight of the active energy ray polymerizable compound. As a result, the reaction of the active energy ray polymerizable compound can be effectively induced and deterioration of the physical properties of the pressure-sensitive adhesive composition due to the residual components after curing can be also prevented.

In an embodiment of the present application, the encapsulation layer of the encapsulation film may further comprise a curing agent depending on the kind of the encapsulating resin. For example, it may further comprise a curing agent capable of reacting with the above-mentioned encapsulating resin to form a cross-linked structure or the like.

The kind of the curing agent may be appropriately selected and used depending on the type of the encapsulating resin or the functional group contained in the resin.

In one example, when the encapsulating resin is an epoxy resin, the curing agent is a curing agent known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulating resin. For example, the curing agent may be included in an amount of 1 part by weight to 20 parts by weight, 1 part by weight to 10 parts by weight or 1 part by weight to 5 parts by weight, relative to 100 parts by weight of the encapsulating resin. However, the weight ratio can be changed depending on the type and ratio of the encapsulating resin or the functional group of the resin, or the cross-linking density to be implemented, and the like.

When the encapsulating resin is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator may be used.

In one example, the encapsulation layer may further comprise a tackifier, where the tackifier may be, preferably, a hydrogenated cyclic olefin polymer. As the tackifier, for example, a hydrogenated petroleum resin obtained by hydrogenating a petroleum resin can be used. The hydrogenated petroleum resin may be partially or fully hydrogenated and may be also a mixture of such resins. Such a tackifier can be selected to have good compatibility with the pressure-sensitive adhesive composition, excellent moisture barrier property, and low organic volatile components. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000 g/mol. The content of the tackifier can be appropriately adjusted as necessary. For example, the content of the tackifier may be selected in consideration of the gel content to be described below, and the like, and according to one example, it can be included in a ratio of 5 parts by weight to 100 parts by weight, 8 to 95 parts by weight, 10 parts by weight to 93 parts by weight or 15 parts by weight to 90 parts by weight, relative to 100 parts by weight of the encapsulating resin.

The encapsulation layer may further comprise a moisture adsorbent, if necessary. In this specification, the term "moisture adsorbent" may mean a moisture-reactive adsorbent capable of removing moisture or humidity, for example, through chemical reaction with the moisture or humidity that has penetrated the encapsulation film, as described below.

For example, the moisture adsorbent may be present in an evenly dispersed state in the encapsulation layer. Here, the evenly dispersed state may mean a state where the moisture adsorbent is present at the same or substantially the same density even in any portion of the encapsulation layer. The moisture adsorbent that can be used in the above may include, for example, a metal oxide, a sulfate or an organometallic oxide, and the like. Specifically, an example of the sulfate may include magnesium sulfate, sodium sulfate or nickel sulfate, and the like, and an example of the organometallic oxide may include aluminum oxide octylate and the like. Here, a specific example of the metal oxide may include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be included in the encapsulation layer, one or two or more of the above-mentioned constitutions may be also used. In one example, when two or more are used as the moisture adsorbent, calcined dolomite and the like may be used.

Such a moisture adsorbent can be controlled to an appropriate size depending on applications. In one example, the average particle diameter of the moisture adsorbent can be controlled to 10[o1] to 15000 nm or so. The moisture adsorbent having a size within the above range has a reaction rate with moisture which is not too fast and thus is easy to store, and may do not damage to the element to be encapsulated, and effectively remove moisture.

The content of the moisture adsorbent is not particularly limited, which may be suitably selected in consideration of the desired blocking characteristics.

The encapsulation layer may also comprise a moisture blocker, if desired. In this specification, the term "moisture blocker" may mean a material which has free or low reactivity with moisture, but can block or hinder movement of moisture or humidity within the film. As the moisture blocker, for example, one or two or more of clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and may be suitably selected in consideration of the desired blocking characteristics.

In addition to the above-described constitutions, the encapsulation layer may comprise various additives depending on applications and the manufacturing process of the encapsulation film to be described below. For example, the encapsulation layer may comprise a curable material, a cross-linking agent, a filler or the like in an appropriate range of content depending on the intended physical properties.

In an embodiment of the present application, the encapsulation layer may be formed in a single layer structure as described above, or may be formed of two or more layers. In an embodiment of the present invention, the first layer or the second layer may comprise, in addition to the above-mentioned resin, other constitutions, for example, the active energy ray polymerizable compound, the thermosetting compound, the radical initiator, the tackifier, the moisture adsorbent, the moisture blocker, the dispersant, the silane compound or the like, as described above, where the constitutions of the first layer and the second layer may be the same or different from each other. On the other hand, the content of the moisture adsorbent can be controlled in consideration of damage of the element and the like, considering that the encapsulation film is applied to the encapsulation of the organic electronic element. For example, the layer contacting the element may comprise a small amount of moisture adsorbent, or may comprise no moisture adsorbent. In one example, the first layer or the second layer in contact with the organic electronic element may comprise 0 to 20% of moisture adsorbent relative to the total mass of the moisture adsorbent included in the encapsulation film. In addition, the second layer or the first layer which does not contact the organic electronic element may comprise 80 to 100% of moisture adsorbent relative to the total mass of the moisture adsorbent included in the encapsulation film. The contact with the organic electronic element also includes the case of contact with the passivation membrane formed on the electrode of the organic electronic element.

The lamination order of the first layer and the second layer is not particularly limited, where the second layer may be formed on the first layer, and conversely, the first layer may be formed on the second layer. Furthermore, the encapsulation layer may be composed of three or more layers, and for example, the first layer may be included in two or more layers, or the second layer may be included in two or more layers. In one example, the second layer may be present on one side of the above-described metal layer, and the first layer may encapsulate the entire surface of the organic electronic element.

The thickness of the encapsulation layer included in the encapsulation film of the present application is not particularly limited, which may be appropriately selected in accordance with the following conditions in consideration of the application to which the film is applied. The thickness of the encapsulation layer may be 5 μm to 200 μm, 10 μm to 100

μm, 20 μm to 80 μm, or 30 μm to 70 μm. The present application can realize sufficient adhesion and physical protection characteristics by setting the thickness of the encapsulation layer to 5 μm or more, and can ensure processability and prevent damage to the deposited membrane of an organic light emitting element because of large thickness expansion due to moisture reactivity by setting it to 200 μm or less.

The present application also relates to an organic electronic device. As shown in FIG. 2, the organic electronic device may comprise a substrate (21); an organic electronic element (22) formed on the substrate (21); and the above-described encapsulation film (10) which encapsulates the entire surface, for example, the upper part and side surfaces of the organic electronic element (22). The encapsulation film (10) may comprise an encapsulation layer (11), which comprises a pressure-sensitive adhesive composition or an adhesive composition in a crosslinked state, a metal layer (12) and a protective layer (13). Furthermore, an organic electronic device may be formed such that the encapsulation layer contacts the entire surface of the organic electronic element. The encapsulation layer may be formed as a structural pressure-sensitive adhesive layer that efficiently fixes and supports the substrate and the metal layer while exhibiting excellent moisture barrier properties and optical characteristics in the organic electronic device.

The organic electronic element may comprise a passivation membrane. The passivation membrane may comprise, for example, an inorganic membrane and an organic membrane. In one embodiment, the inorganic membrane may be one or more metal oxides or nitrides selected from the group consisting of Al, Zr, Ti, Hf, Ta, In, Sn, Zn and Si. The inorganic membrane may have a thickness of 0.01 μm to 50 μm or 0.1 μm to 20 μm or 1 μm to 10 μm. In one example, the inorganic membrane of the present application may be an inorganic material containing no dopant, or may be an inorganic material containing a dopant. The dopant which can be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto. The organic membrane is distinguished from the organic layer containing at least a light emitting layer in that it does not include a light emitting layer, and may be an organic deposition layer containing an epoxy compound.

The inorganic film or the organic film may be formed by chemical vapor deposition (CVD). For example, as the inorganic film, silicon nitride (SiNx) may be used. In one example, silicon nitride (SiNx) used as the inorganic film may be deposited to a thickness of 0.01 μm to 50 μm. In one example, the organic film may have a thickness in a range of 2 μm to 20 μm, 2.5 μm to 15 μm, and 2.8 μm to 9 μm.

The organic electronic element may be, for example, an organic light emitting element.

The present invention also relates to a method for manufacturing an organic electronic device. The organic electronic device may be manufactured using, for example, the above-described encapsulation film.

The manufacturing method may comprise, for example, a step of applying the above-described encapsulation film to a substrate, on which an organic electronic element is formed, so as to cover the organic electronic element. The manufacturing method may further comprise a step of curing the encapsulation film. The curing step can be performed before or after the step of applying it to cover the organic electronic element.

In this specification, the term "curing" may mean that the composition constituting the encapsulation layer or the protective layer forms a crosslinked structure via a heating or UV irradiation process or the like.

Specifically, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming a reflective electrode layer thereon. The organic electronic element may be manufactured by further forming a passivation membrane on the upper reflective electrode layer. Subsequently, the present application can manufacture the organic electronic device by positioning the entire surface of the organic electronic element of the substrate subjected to the above processes so as to cover the encapsulation layer of the encapsulation film.

Advantageous Effects

The present application provides an encapsulation film which allows forming a structure capable of blocking moisture or oxygen introduced into an organic electronic device from the outside and has excellent handling properties and processability, thereby minimizing the appearance change of the film and preventing physical and chemical damage.

BRIEF DESCRIPTION OF DRAWINGS

FIG. 1 is a cross-sectional view showing an encapsulation film according to one example of the present application.

FIG. 2 is a cross-sectional view showing an organic electronic device according to one example of the present invention.

FIGS. 3 to 6 are endurance reliability experiment photographs of encapsulation films according to Examples and Comparative Examples.

EXPLANATION OF REFERENCE NUMERALS

10: encapsulation film
11: encapsulation layer
12: metal layer
13: protective layer
21: substrate
22: organic electronic element

BEST MODE

Hereinafter, the above-described details will be described in more detail with reference to Examples and Comparative Examples. However, the scope of the present application is not limited by the following examples.

Example 1

Preparation of Protective Layer Solution

A styrene-isobutylene copolymer (SIBS 103T, Mw: 100,000 g/mol, Kaneka), a hydrogenated bisphenol A epoxy resin (YX8000, Mw: 3,810 g/mol, epoxy equivalent: 201 g/eq, Mitsubishi Chemical) and an alicyclic epoxy resin (Celloxide 2021P, Mw: 250 g/mol, Daicel Corporation) were each introduced into a reaction vessel at a weight ratio of 50:30:20 (SIBS103T: YX8000: Celloxide2021P), and Irgacure 290 as a cationic photoinitiator was added thereto in an amount of 0.1 parts by weight relative to 100 parts by weight of the resin component, and then the mixture was diluted with toluene to a solid content of about 15 wt % or so to prepare a protective layer composition coating solution.

The prepared solution was applied on the release surface of the releasing PET and dried in an oven at 100° C. for 15 minutes to form a protective layer having a thickness of 15 μm.

Production of Encapsulation Layer

A CaO (average particle diameter less than 5 μm) solution (solid content 50%) was prepared as a moisture adsorbent. Separately, a solution (solid content 50%), in which 200 g of a butyl rubber resin (BT-20, Sunwoo Chemtech) and 60 g of a DCPD petroleum resin (SU5270, Sunwoo Chemtech) were diluted with toluene, was prepared and then the solution was homogenized. 10 g of a multifunctional compound (trimethylolpropane triacrylate, TMPTA, Miwon) and 15 g of a photoinitiator (Irgacure 819, Ciba) were introduced to the homogenized solution, homogenized and then 100 g of the CaO solution was introduced thereto, followed by stirring at high speed for 1 hour to prepare a solution of an encapsulation layer.

The above-prepared encapsulation layer solution was applied to the release surface of a releasing PET using a comma coater and dried in a dryer at 130° C. for 3 minutes to form an encapsulation layer having a thickness of 60 μm.

Production of Encapsulation Film

The release-treated PET attached to the outside of the above-produced protective layer was peeled off, the protective layer was laminated on one side of the metal layer (copper, 18 μm) prepared in advance, and the above-produced encapsulation layer was laminated on the other side of the metal layer to produce an encapsulation film.

Example 2

An encapsulation film was produced in the same manner as in Example 1, except that a bisphenol A epoxy resin (YP-50, Mw: 65,000 g/mol, Kukdo Chemical), a hydrogenated bisphenol A epoxy resin (YX8000, Mw: 3,810 g/mol, epoxy equivalent: 201 g/eq, Mitsubishi Chemical) and an alicyclic epoxy compound (Celloxide 2021P, Mw: 250 g/mol, Daicel Corporation) were each introduced into the reaction vessel at a weight ratio of 50:30:20 (YP-50: YX8000: Celloxide2021P) at the time of producing the protective layer.

Comparative Example 1

An encapsulation film was produced in the same manner as in Example 1, except that PET (polyethylene terephthalate) having a urethane-based adhesive (glass transition temperature: −20° C.) on one side was used as the protective layer and formed on the metal layer (in the order of PET/urethane-based adhesive/metal layer).

Comparative Example 2

An encapsulation film was produced in the same manner as in Example 1, except that the protective layer was not used.

Comparative Example 3

An encapsulation film was produced in the same manner as in Example 1, except that the protective layer was formed to have a thickness of 3 μm.

Comparative Example 4

An encapsulation film was produced in the same manner as in Example 1, except that to prepare a protective layer composition coating solution, 200 g of a butyl rubber resin (BT-20, Sunwoo Chemtech), 60 g of a DCPD-based petroleum resin (SU5270, Sunwoo Chemtech) and 15 g of a multifunctional compound (TMPTA, Miwon) were introduced into a vessel, and then toluene was added so as to have a solid content of 20 wt %. The Tg of the resin component is −50° C.

Comparative Example 5

An encapsulation film was produced in the same manner as in Example 1, except that the base and the curing agent of Sylgard 184 (polydimethylsiloxane, Tg: −100° C.) from Dow Corning were mixed in a weight ratio of 5:1 to prepare a protective layer composition coating solution.

Experimental Example 1—Confirmation of Endurance Reliability of Metal Layer

The encapsulation films prepared in Examples and Comparative Examples were each bonded to glass and the encapsulation films were each irradiated with light having a wavelength range of UV-A region band at a light quantity of 3 J/cm$^2$, and then heat-treated in an oven at 100° C. for 3 hours to prepare a specimen. Thereafter, the specimen was maintained in a constant temperature and humidity chamber at 85° C. and 85% relative humidity for 30 days, and then the color change of the metal layer was confirmed. FIGS. 3 to 6 are photographs of the encapsulation films of Examples 1 and 2 and Comparative Examples 1 and 2 in this order, respectively, after the above experiment. In Comparative Examples 1 and 2, it can be confirmed that the color change of the metal layer occurs.

Experimental Example 2—Endurance Reliability of Organic Electronic Device at High Temperature After the organic electronic elements were each deposited on a glass substrate, the encapsulation films prepared in Examples and Comparative Examples above were each bonded on the element under conditions of 50° C., a vacuum level of 50 mtorr and 0.4 MPa using a vacuum bonding machine, and irradiated with light having a wavelength range of UV-A region band at a light quantity of 3 J/cm$^2$, and then heat was applied thereto in an oven at 100° C. for 3 hours to prepare an organic electronic panel.

Thereafter, while the prepared organic electronic panel was held in a constant temperature and humidity chamber at 85° C. and 85% relative humidity for 500 hours, lifting between the film and the element was confirmed, and when the lifting occurred, it was classified as X.

Experimental Example 3—Surface Property

After the encapsulation films prepared in Examples and Comparative Examples were each irradiated with UV rays having an intensity of 1000 mW/cm$^2$ at 3 J/cm$^2$, tack free time of the protective layer at room temperature was measured. The time until the tacky feeling disappears and there is no sticking out when touching the surface of the protective layer immediately after curing is defined as tack free time and measured. When the tack free time was less than 1 minute, it was classified as O; when it was 5 minutes or more, it was classified as Δ; and when it was 30 minutes or more, it was classified as X.

TABLE 1

|  | Endurance Reliability of Metal Layer | Endurance reliability of Organic Electronic Device | Surface Property of Protective Layer |
|---|---|---|---|
| Example 1 | Good (FIG. 3) | Good | ○ |
| Example 2 | Good (FIG. 4) | Good | ○ |
| Comparative Example | 1 Color change occurrence (FIG. 5) | X | ○ |
|  | 2 Color change occurrence (FIG. 6) | Good | — |
|  | 3 Color change occurrence | X | ○ |
|  | 4 Good | Good | X |
|  | 5 Color change occurrence | Good | X |

As a result of the surface property of the protective layer, in the case of Comparative Examples 4 and 5 in which the tacky property was high, the multiple sheets of the encapsulation films to be laminated adhered to each other, so that the encapsulation process of the organic electronic element was substantially impossible.

The invention claimed is:

1. An encapsulation film comprising an encapsulation layer, a metal layer and a protective layer,
   wherein the protective layer has a thickness of more than 5 μm and comprises a resin component,
   wherein a glass transition temperature of the resin component after curing is 0° C. or higher, the glass transition temperature measured after curing the encapsulation film by heating at a temperature in a range of 50 to 300° C.; by irradiating ultraviolet ray; or by both, and
   wherein the resin component is a thermosetting resin, a photo-curing resin or a dual curing resin, comprises a curable oligomer and a curable monomer, and comprises an epoxy resin having a cyclic structure in addition to the epoxy group in its molecular structure.

2. The encapsulation film according to claim 1, wherein the encapsulation layer is formed as a single layer or a multilayer of two or more layers.

3. The encapsulation film according to claim 1, wherein the encapsulation layer comprises encapsulating resin having a glass transition temperature of less than 0° C. after curing.

4. The encapsulation film according to claim 1, wherein the encapsulation layer comprises a moisture adsorbent.

5. The encapsulation film according to claim 4, wherein the moisture adsorbent is a moisture-reactive adsorbent.

6. The encapsulation film according to claim 1, wherein the encapsulation layer comprises a multifunctional active energy ray polymerizable compound.

7. The encapsulation film according to claim 1, wherein the metal layer comprises any one of a metal, a metal oxide, a metal nitride, a metal carbide, a metal oxynitride, a metal oxyboride, and a combination thereof.

8. The encapsulation film according to claim 1, wherein the metal layer comprises any one of iron, aluminum, copper, nickel, silicon oxide, aluminum oxide, titanium oxide, indium oxide, tin oxide, indium tin oxide, tantalum oxide, zirconium oxide, niobium oxide, and a combination thereof.

9. The encapsulation film according to claim 1, wherein the protective layer has a thickness in a range of more than 5 μm and 50 μm or less.

10. The encapsulation film according to claim 1, wherein the protective layer has a tensile elastic modulus in a range of 0.01 MPa to 1000 MPa at 25° C.

11. The encapsulation film according to claim 1, wherein the resin component has a glass transition temperature after curing in a range of 50° C. to 200° C.

12. The encapsulation film according to claim 1, wherein the curable oligomer and the curable monomer are comprised in amounts of 15 to 35 parts by weight and 10 to 40 parts by weight, respectively.

13. The encapsulation film according to claim 1, wherein the curable oligomer has a weight average molecular weight in a range of 400 to 10,000 g/mol, and the curable monomer has a weight average molecular weight of less than 400 g/mol.

14. The encapsulation film according to claim 1, wherein the protective layer comprises an initiator or a curing agent.

15. An organic electronic device comprising a substrate, an organic electronic element formed on the substrate, and the encapsulation film according to claim 1 for encapsulating the entire surface of the organic electronic element.

16. A method for manufacturing an organic electronic device comprising a step of applying the encapsulation film according to claim 1 a substrate, on which an organic electronic element is formed, so as to cover the organic electronic element.

* * * * *